HIGH ORDER VARACTOR FREQUENCY MULTIPLIER

Original Filed March 27, 1963

HARRISON YOSHIMITSU MIYAHIRA
INVENTOR.

BY [signature]
AGENT

United States Patent Office 3,381,208

Patented Apr. 30, 1968

3,381,208

HIGH ORDER VARACTOR FREQUENCY MULTIPLIER

Harrison Yoshimitsu Miyahira, Torrance, Calif., assignor, by mesne assignments, to TRW Inc., a corporation of Ohio Continuation of application Ser. No. 268,277, Mar. 27, 1963. This application Dec. 30, 1966, Ser. No. 606,455
2 Claims. (Cl. 321—69)

ABSTRACT OF THE DISCLOSURE

A single varactor forming the basis for a varactor multiplier is electrically and thermally coupled to a block member that is uniquely coupled to the input resonant circuit, the idler resonant circuits and the output circuit.

This invention relates to the art of frequency multiplication from a low frequency source to frequencies in the microwave region and more particularly, to a varactor multiplier using idler resonating circuits for generating high frequencies having substantial high power and high efficiency.

This application is a continuation of application Ser. No. 268,277, filed Mar. 27, 1963, and now abandoned.

In the communication and radar art, it is often necessary to generate microwave energy which usually requires electron discharge devices of the klystron or magnetron type. For those installations in which electron discharge devices are not desirable because of size and reliability as the source of the microwave energy, it is necessary to use semi-conductor nonlinear resistance diodes as the means for generating and multiplying these low frequencies. The conversion efficiency of these devices is relatively poor, especially when multiplying by factors greater than two which would be necessary in order to achieve frequencies in the microwave region.

In this invention, a nonlinear voltage variable capacitor commonly called a varactor is used to generate relatively high power at microwave frequencies and with high conversion efficiency.

The invention is preferably implemented by means of a series resonant circuit including a varactor that is excited by an input signal having a frequency equal to the resonant frequency of the defined series circuit. A second series resonant circuit, also called an idler circuit, includes said varactor, and is tuned to a frequency of $2\omega_1$ which results in voltages being generated in said varactor having a frequency of $3\omega_1$ and $4\omega_1$ only. To obtain an output frequency of $3\omega_1$, for example, an output resonant circuit including said varactor is tuned to $3\omega_1$. The output frequency of $3\omega_1$ is obtained by coupling the signal from the output resonator.

In order to obtain an output frequency of either $5\omega_1$, $6\omega_1$ or $8\omega_1$, an additional idler resonator tuned to $4\omega_1$ must be used. If a coaxial transmission line is used, the first idler may be tuned to $2\omega_1$ which also presents a low impedance to frequencies of $2\omega_1$ as well as $4\omega_1$. It can be shown that voltages having a frequency of $5\omega_1$, $6\omega_1$ and $8\omega_1$ are thereby generated in the varactor. The voltages of $3\omega_1$ and $4\omega_1$ result from the resonant idler circuit being tuned to $2\omega_1$. The frequencies of $5\omega_1$, $6\omega_1$ and $8\omega_1$ result from the idler resonant circuit being tuned to $4\omega_1$. The output signal is obtained from an additional output resonant circuit tuned to the available and desired output frequency.

A varactor frequency quintupler, is constructed by using an idler circuit tuned to $2\omega_1$ and $4\omega_1$. The output frequency of $5\omega_1$ is obtained from an output circuit that is tuned to $5\omega_1$. The defined quintupler is implemented by including the varactor in a first series resonant circuit that is tuned to the desired input frequency $\omega_1$. The first series resonant circuit is excited by an input signal $\omega_1$ having a frequency equal to the resonant frequency of the defined series circuit. A second series resonant circuit (idler circuit) which includes said varactor is tuned to a frequency of $2\omega_1$, thereby producing a low impedance path at $4\omega_1$ and at $2\omega_1$ which is substantially a short circuit to currents passing through the varactor at a frequency of $2\omega_1$ and $4\omega_1$. The mathematical analysis shows that the low impedance path to a current at a frequency of $2\omega_1$ will generate voltages in the varactor having a frequency of $3\omega_1$ and $4\omega_1$. Since the idler series resonant circuit is also tuned to $4\omega_1$ the short circuit current, at a frequency of $4\omega_1$ also flows through the varactor. The $4\omega_1$ current can be shown to generate voltages having a frequency of $5\omega_1$, $6\omega_1$ and $8\omega_1$. In the case of the quintupler separate idler resonant circuits tuned to $2\omega_1$ and $4\omega_1$ could have been used instead of a single idler circuit tuned to $3\omega_1$. The effect in either case is the same. The output current at $5\omega_1$ is obtained by means of an output series resonant circuit which includes said varactor and is tuned to $5\omega_1$.

Further objectives and advantages of the present invention will be made more apparent by referring now to the accompanying drawings wherein.

Figures 1, 2, 3:
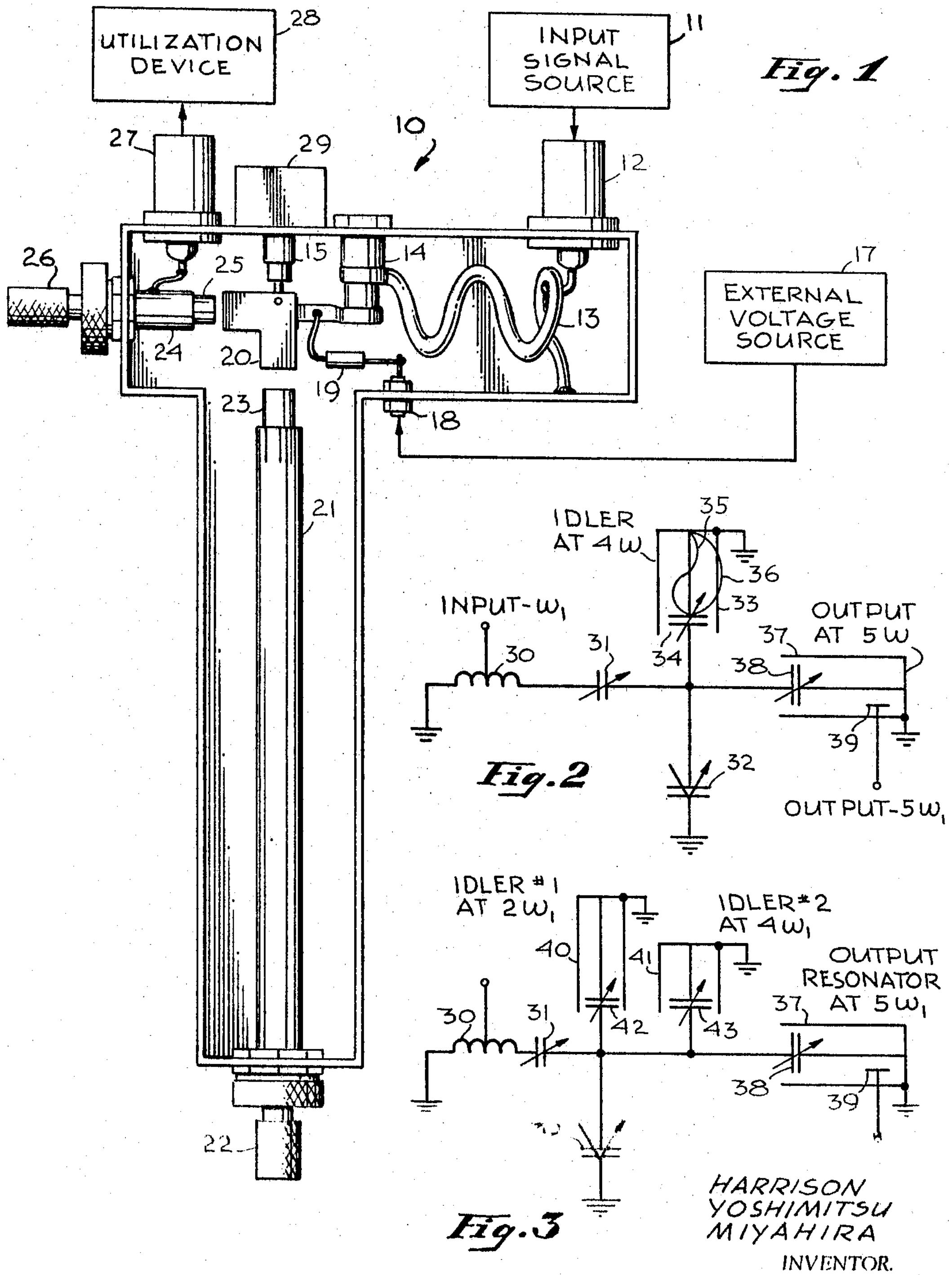
FIGURE 1 illustrates a quintupler multiplier constructed according to the teachings of this invention.
FIGURE 2 is a schematic diagram of the AC operation of the quintupler illustrated in FIGURE 1.
FIGURE 3 is a schematic diagram illustrating how the invention may be implemented by using a pluralty of idler circuits.

Referring now to FIGURE 1, there is illustrated a preferred embodiment of the invention in the form of a quintupler designed to operate at an input frequency of $\omega_1$=648 mc. The entire device is contained in a shielded container 10. An input signal having a frequency of $\omega_1$ is fed from an input signal source to an input terminal 12 located on container 10 and suitably insulated therefrom. The input terminal 12 is connected to an inductor 13 that is connected in series with a capacitor 14 and a varactor 15 to form a first series resonant circuit that is tuned to the input frequency of $\omega_1$ by means of capacitor 14. The varactor 15 is connected to the container 10 at one end while the voltage end is preferably biased by means of an external voltage source 17 that is connected to a terminal 18 through an isolating resistor 19 to the varactor 15. The exact bias voltage generated by the external voltage source 17 and the value of the isolating resistor 19 will be determined by the characteristics of the actual varactor 15 and the frequency of operation selected. A conductive block 20 electrically insulated from the case 10 provides a convenient terminal for the voltage end of the varactor 15, the resistor 19 and the capacitor 14.

In order to achieve the desired output frequency of $5\omega_1$, a single resonant idler circuit comprising a coaxial resonator 21, and the series connected varactor 15 is tuned to a frequency of $2\omega_1$. The actual tuning of the idler resonant circuit 21 is accomplished by means of a control 22 arranged to move a tuning slug 23 into a tuning relationship with respect to the block 20 which is electrically connected to the varactor 15. The idler circuit 21 together with the distributed capacity between the slug 23 and the block 20 in series with the varactor 15 defines the resonant idler circuit which is tuned to $2\omega_1$.

The output currents having a frequency of $5\omega_1$ are obtained by means of an output series resonant circuit comprising a coaxial resonator 24, a tuning slug 25 operated by a control 26 and the varactor 15. The output resonant circuit is tuned by means of control 26 to a frequency of $5\omega_1$ by varying the distributed capacity between the slug 25 and the block 20. The output signal from the resonator 24 is fed through a terminal 27 to a utilization device 28, antenna or other multiplying device.

The input circuit is tuned to $\omega_1$ by a lumped constant LC network consisting of inductor 13 which is matched to the varactor 15 by tuning the variable capacitor 14. The idler resonant circuit is tuned to $2\omega_1$, which also presents a short circuit to currents of $4\omega_1$ by virtue of the coaxial transmission line. The effect is to short circuit both currents having a frequency of $2\omega_1$ and $4\omega_1$ that are generated in the varactor 15. A heat sink 29 is mechanically connected to the outside of the container 10 at a point in close proximity to the varactor 15 for establishing a low thermal conductivity path to the semiconductor portion of the varactor. The heat sink allows operation at high power levels without saturation or damage to the varactor.

Referring now to FIGURE 2, there is shown a schematic diagram of the quintupler multiplier illustrated in FIGURE 1. The defined input series resonant circuit comprises an inductance 30, a variable capacitor 31 and a varactor 32. The input series resonant circuit is excited by an input frequency of $\omega_1$. The second resonant circuit or idler circuit consists of a resonator circuit 33, variable capacitor 34 and the varactor 32, which is tuned to a frequency of $2\omega_1$, as shown by curve 36. A short circuit is also presented to currents of $4\omega_1$ as shown by curve 35. The output frequency of $5\omega_1$ is obtained by means of a series resonant circuit consisting of a resonator 37, a variable capacitor 38 and the varactor 32. The output frequency of $5\omega_1$ is obtained by a suitable coupling device 39 located within the resonator 37 for detecting the output frequency of $5\omega_1$.

Referring now to FIGURE 3, there is shown a schematic diagram illustrating a quintupler similar to that illustrated in FIGURE 2 with the exception that two separate idler resonating circuits 40 and 41 are used instead of the single resonating circuit 33 illustrated in FIGURE 2. The first idler resonator 40 is in series with a capacitor 42 and the varactor 32. The complete series circuit is tuned to a frequency of $2\omega_1$ which has the effect of generating voltages in the varactor 32 having a frequency of $3\omega_1$ and $4\omega_1$. The second idler circuit comprising resonator 41, capacitor 43 and the varactor 32 defines the second series circuit which is tuned to a frequency of $4\omega_1$ thereby generating voltages in the varactor 32 having a frequency of $5\omega_1$, $6\omega_1$ and $8\omega_1$. The configuration of utilizing additional idler circuits is sometimes necessary depending on the ultimate frequency desired. For example, it is found desirable in generating a frequency equal to $19\omega_1$ to use five separate idler resonators tuned to $2\omega_1$, $4\omega_1$, $6\omega_1$, $7\omega_1$ and $12\omega_1$, respectively.

In addition, separate idler resonant circuits, one for each idler resonant frequency, must be used when using lumped constant component devices.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

What is claimed is:

1. A harmonic generator comprising: a hollow conducting enclosure, a first series resonant circuit within said enclosure including a non-linear voltage variable capacitor tuned to a resonant frequency, means for exciting said first resonant circuit with a signal at said resonant frequency, a coaxial transmission line resonator coupled to said enclosure and forming one series resonant idler circuit including said capacitor tuned to a multiple frequency of said signal, an additional coaxial transmission line resonator coupled to said enclosure and forming an additional resonant idler circuit including said capacitor tuned to a multiple frequency of said signal, and an output coaxial transmission line resonator coupled to said enclosure and forming a series resonant circuit including said capacitor tuned to a multiple frequency of said signal, each of said coaxial line resonators having an adjustable tuning member capacity coupled to a common terminal of said capacitor.

2. In the harmonic generator of claim 1, a different terminal of said capacitor connected to said conducting enclosure, and a heat sink connected to said enclosure at a position proximate the connection to said capacitor whereby the thermal resistance from said capacitor to said external heat sink is minimized.

References Cited

UNITED STATES PATENTS 3,172,048 3/1965 Ohnsorge ___________ 330—4.9

OTHER REFERENCES

Varactor Applications, by Penfield and Rafuse, M.I.T. Press, 1962; pages 307–315 and 435 relied upon; TK 7872–V4P4 in Sci. Lib.

JOHN F. COUCH, *Primary Examiner.*

G. GOLDBERG, *Assistant Examiner.*